(12) United States Patent
Wang et al.

(10) Patent No.: US 8,901,607 B2
(45) Date of Patent: Dec. 2, 2014

(54) SEMICONDUCTOR DEVICE AND FABRICATING THE SAME

(71) Applicant: Taiwan Semiconductor Manufacturing Company, Ltd., Hsin-Chu (TW)

(72) Inventors: Chih-Hao Wang, Hsin-Chu (TW); Kuo-Cheng Ching, Zhubei (TW); Gwan Sin Chang, Hsinchu (TW); Zhiqiang Wu, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/740,373

(22) Filed: Jan. 14, 2013

(65) Prior Publication Data
US 2014/0197456 A1  Jul. 17, 2014

(51) Int. Cl.
*H01L 29/66* (2006.01)
*H01L 29/78* (2006.01)

(52) U.S. Cl.
CPC ........ *H01L 29/785* (2013.01); *H01L 29/66545* (2013.01)
USPC .......................................... 257/192; 257/351

(58) Field of Classification Search
CPC ...................... H01L 29/66818; H01L 29/7856
USPC ................................................. 257/192, 351
See application file for complete search history.

(56) References Cited

U.S. PATENT DOCUMENTS 6,359,311 B1 * 3/2002 Colinge et al. ................. 257/347

OTHER PUBLICATIONS

Masanori Tanaka et al., "Abnormal Oxidation Characteristics of SiGe/Si-on-insulator Structures Depending on Piled-Up Ge Fraction at SiO2/SiGe Interface," Journal of Applied Physics 103, 2008, pp. 054909-1 through 054909-5, American Institute of Physics.
F. K. Legoues, et al., "Kinetics and Mechanism of Oxidation of SiGe: Dry Versus Wet Oxidation," Applied Physics Letters 54, Feb. 13, 1989, pp. 644-646, American Institute of Physics.
Tetelin et al., "Kinetics and Mechanism of Low Temperature Atomic Oxygen-Assisted Oxidation of SiGe Layers," Journal of Applied Physics, Mar. 1, 1998, pp. 2842-2846, vol. 83, No. 5, American Institute of Physics.
P. Gas et al., "Diffusion of Sb, Ga, Ge, and (As) in TiSi2," Journal of Applied Physics, Jun. 1, 1988, pp. 5335-5345, vol. 63, No. 11, American Institute of Physics.

* cited by examiner

*Primary Examiner* — Daniel Whalen
(74) *Attorney, Agent, or Firm* — Haynes and Boone, LLP

(57) ABSTRACT

The present disclosure provides a semiconductor device. The semiconductor device includes a substrate having a gate region, source and drain (S/D) regions separated by the gate region and a first fin structure in a gate region in the N-FET region. The first fin structure is formed by a first semiconductor material layer as a lower portion, a semiconductor oxide layer as a middle portion and a second semiconductor material layer as an upper portion. The semiconductor device also includes a second fin structure in S/D regions in the N-FET region. The second fin structure is formed by the first semiconductor material layer as a lower portion and the semiconductor oxide layer as a first middle portion, the first semiconductor material layer as a second middle portion beside the first middle and the second semiconductor material layer as an upper portion.

20 Claims, 17 Drawing Sheets

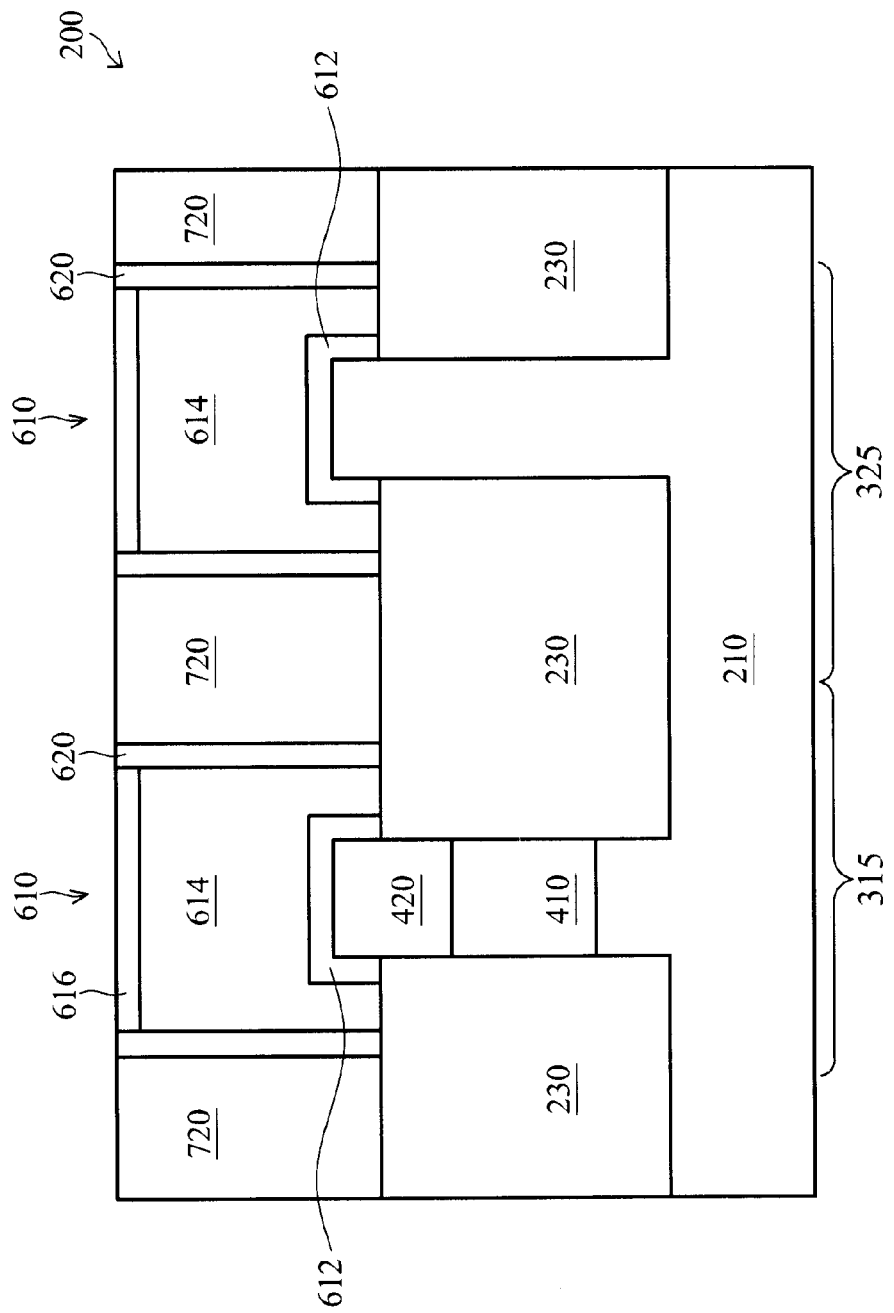

US 8,901,607 B2

1

SEMICONDUCTOR DEVICE AND FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, to introduce stress to a gate channel raises challenges in a FinFET process development. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8A, 9A, 10A, 11A, 12, 13A and 14 are cross-sectional views of a FinFET device along line A-A in FIG. 7 at fabrication stages constructed according to the method of FIG. 1.

DETAILED DESCRIPTION

Figure 1:
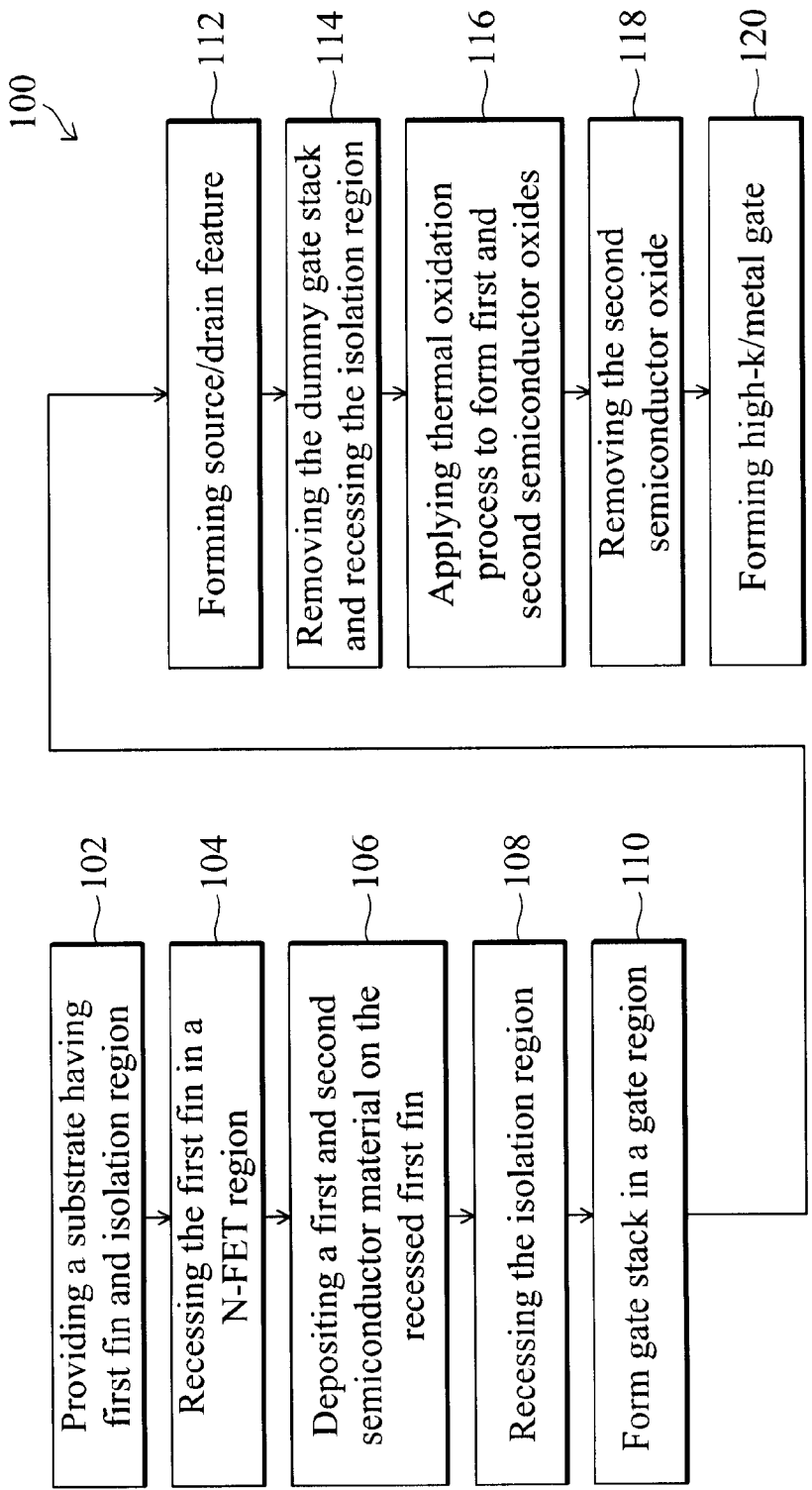
FIG. 1 is a flow chart of an example method for fabricating a FinFET device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may

2 include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 2:
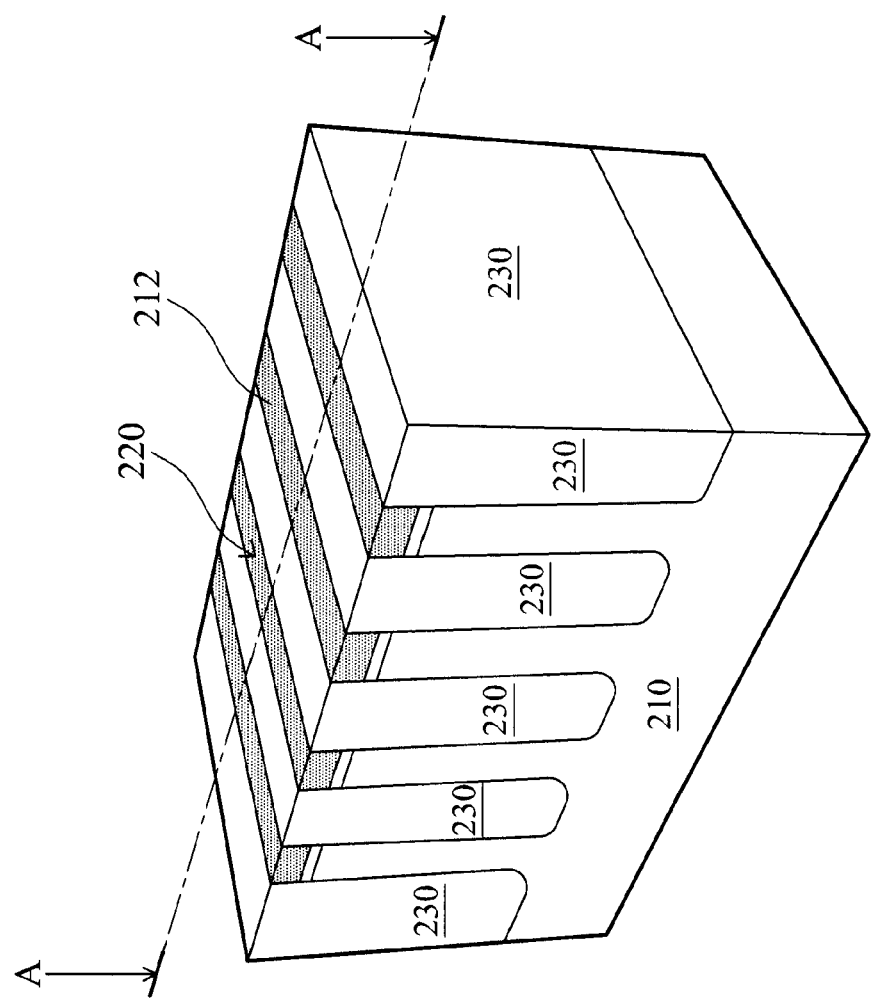
FIG. 2 is a diagrammatic perspective view of a FinFET device undergoing processes according to an embodiment of the present disclosure.

FIG. 1 is a flowchart of a method 100 for fabricating a FinFET device according to aspects of the present disclosure. FIG. 2 is a side-perspective view of the FinFET device manufactured according to the method of FIG. 1. FIGS. 3 to 6 are cross-section views of the FinFET device at fabrication stages constructed according to the method 100 of FIG. 1. FIG. 7 is a side-perspective view of the FinFET device manufactured according to the method 100 of FIG. 1. FIGS. 8A, 9A, 10A, 11A, 12, 13A and 14 are cross section views along the line A-A of FIG. 7. FIGS. 8B, 9B, 10B, 11B and 13B are cross section views along the line B-B of FIG. 7 and perpendicular to the direction of the line of A-A. It is understood that additional steps can be provided before, during, and after the method, and some of the steps described can be replaced or eliminated for other embodiments of the method.

Figure 3:
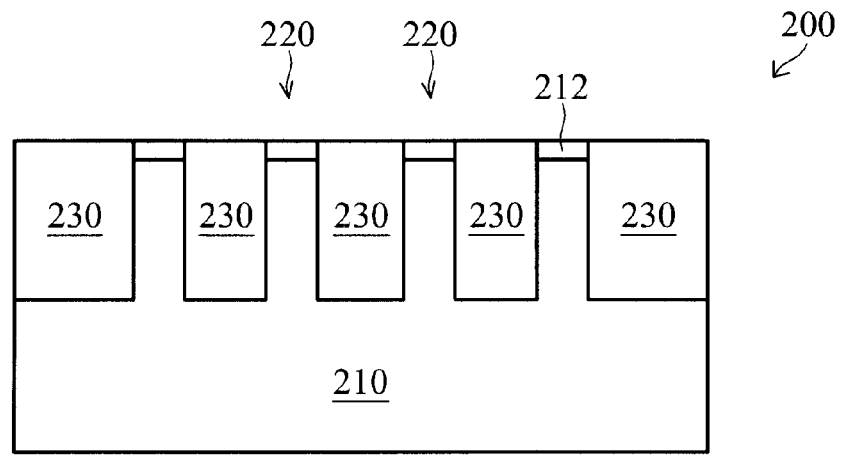
FIGS. 3 to 6 are cross-sectional views of an example FinFET device at fabrication stages constructed according to the method of FIG. 1.

Referring to FIGS. 1 and 2-3, the method 100 begins at step 102 by providing a substrate 210. In the present embodiment, the substrate 210 is a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors, the insulator layer is a component (e.g., layer) of a silicon-on-insulator substrate.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

A first fin 220 is formed on the substrate 210. In some embodiments, the substrate 210 includes more than one first fin 220. The first fin 220 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the substrate 210. The area not protected by the masking element is etched using reactive ion etching (RIE) processes and/or other suitable processes. In an example, the first fin 220 is formed by patterning and etching a portion of the silicon substrate 210. In another example, the first fin 220 is formed by patterning and etching a silicon layer deposited overlying an insulator layer (for example, an upper silicon layer of a silicon-insulator-silicon stack of an SOI substrate. Additionally, a first hard mask layer 212 is deposited on the substrate 210 prior to patterning and etching processes. The first hard mask layer 212 includes silicon oxide, silicon nitride, silicon oxynitride, or any other suitable dielectric material. The first hard mask layer 212 may be a single layer or multiple layers. The first hard mask layer 212 can be formed by thermal oxidation, chemical oxidation, atomic layer deposition (ALD), or any other appropriate method. It is understood that multiple parallel first fins 220 may be formed in a similar manner.

Various isolation regions 230 are formed on the substrate 210 to isolate active regions. For example, the isolation regions 230 separate first fins 220. The isolation region 230 may be formed using traditional isolation technology, such as shallow trench isolation (STI), to define and electrically isolate the various regions. The isolation region 230 includes silicon oxide, silicon nitride, silicon oxynitride, an air gap, other suitable materials, or combinations thereof. The isolation region 230 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide. In one embodiment, a chemical mechanical polishing (CMP) process is performed to remove excessive dielectric materials and planarize the top surface of the isolation regions 230 with the top surface of the first fin 220. Additionally, the CMP process removes the first hard mask as well.

Figure 4:
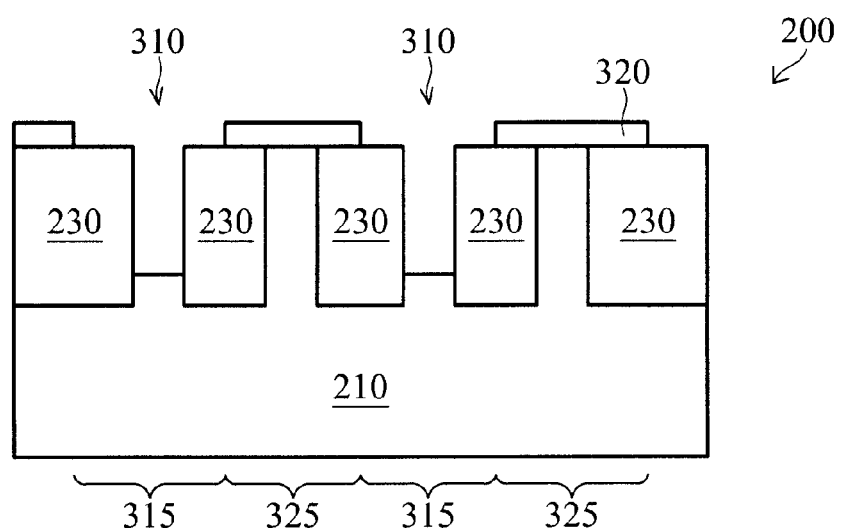

Referring to FIGS. 1 and 4, the method 100 proceeds to step 104 by recessing the first fins 220 to form recessing trenches 310 in an N-type FET region 315. Prior to recessing process, a second hard mask 320 is formed to protect predetermined regions, such as P-type FET region 325. A formation of the second hard mask 320 is similar in many respects to the first hard mask 212 discussed above in association with FIG. 3. The recessing process may include dry etching process, wet etching process, and/or combination thereof. The recessing process may also include a selective wet etch or a selective dry etch. A wet etching solution includes a tetramethylammonium hydroxide (TMAH), a HF/HNO3/CH3COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 5:
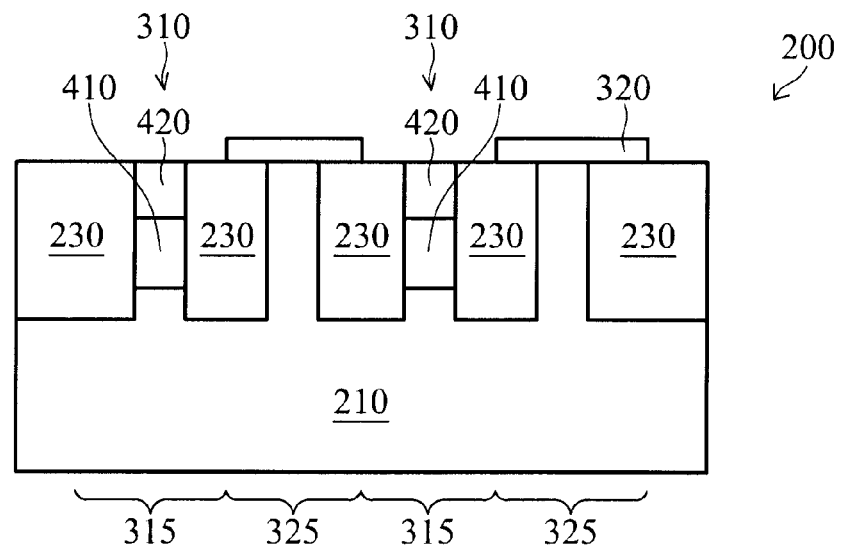

Referring to FIGS. 1 and 5, the method 100 proceeds to step 106 by depositing a first semiconductor material layer 410 in the recess trenches 310 and a second semiconductor material layer 420 on top of the first semiconductor material 410. The first and second semiconductor material layers, 410 and 420, may be deposited by epitaxial growing processes. The epitaxial processes include CVD deposition techniques (e.g., vapor-phase epitaxy (VPE) and/or ultra-high vacuum CVD (UHV-CVD)), molecular beam epitaxy, and/or other suitable processes. The first and second semiconductor material layers, 410 and 420, may include germanium (Ge), silicon (Si), gallium arsenide (GaAs), aluminum gallium arsenide (AlGaAs), silicon germanium (SiGe), gallium arsenide phosphide (GaAsP), or other suitable materials. Additionally, a CMP process may be performed to remove excessive semiconductor material layers, 410 and 420, the second hard mask 320 and planarize top surfaces of the semiconductor material layer 420 and the isolation region 230.

Figure 6:
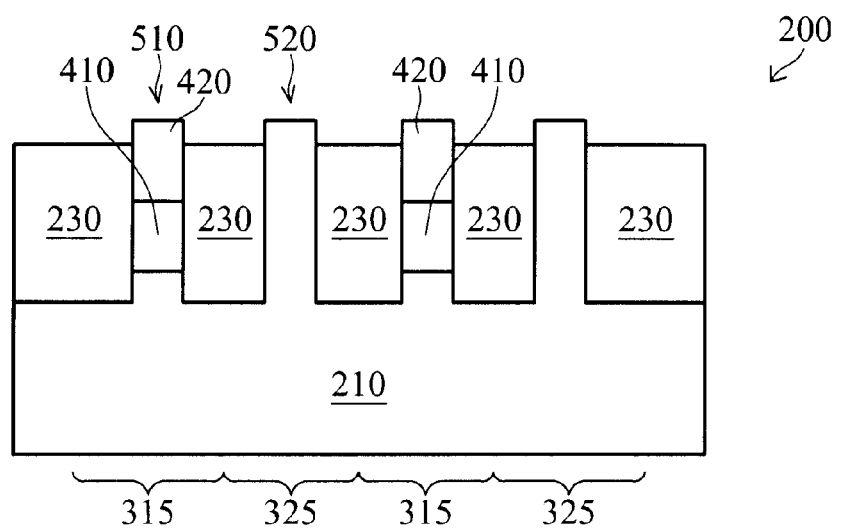
Figure 7:
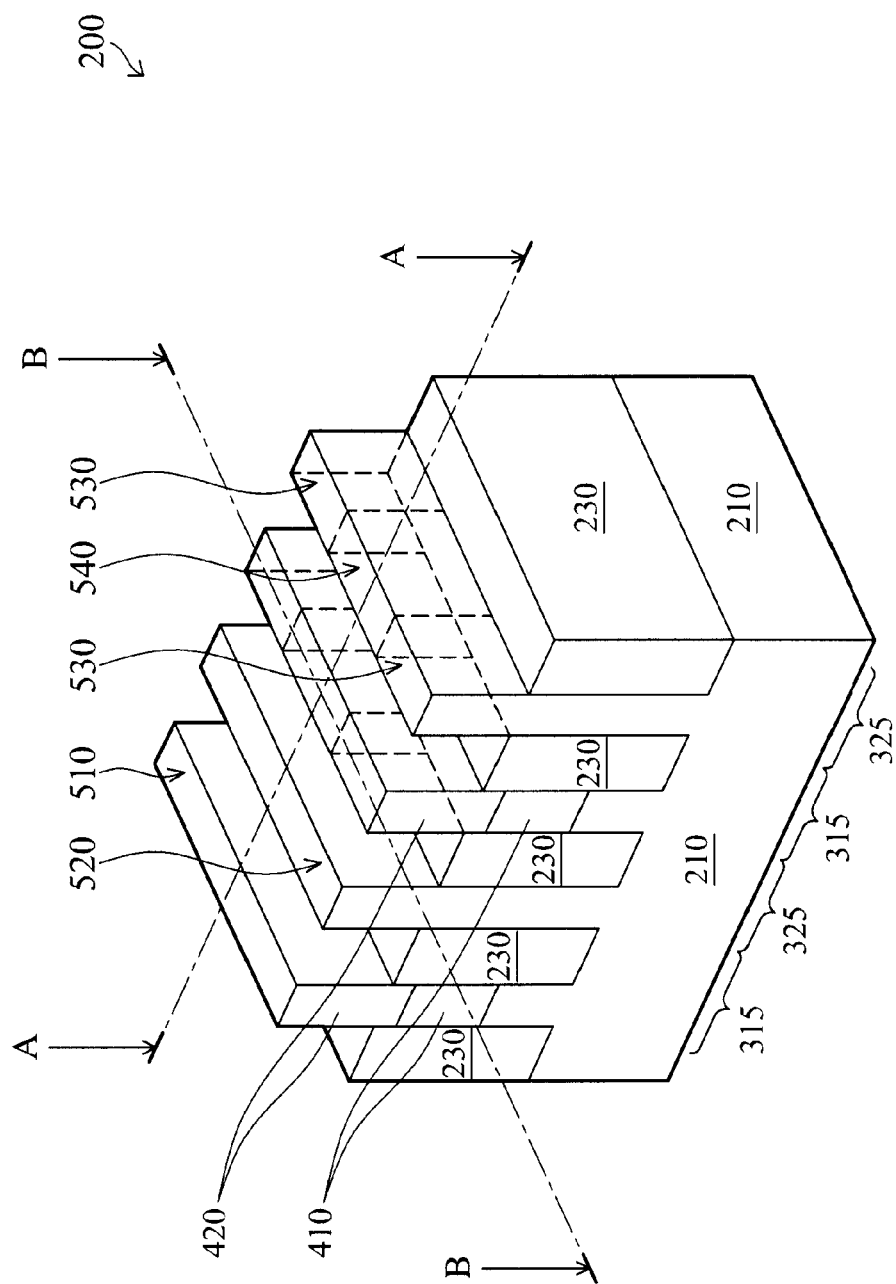
FIG. 7 is a diagrammatic perspective view of a FinFET device undergoing processes according to an embodiment of the present disclosure.

Referring to FIGS. 1 and 6, the method 100 proceeds to step 108 by recessing the isolation regions 230 around the second semiconductor material layer 420 to laterally expose an upper portion of the second semiconductor material layer 420, thereby forming second fins 510 in the N-type FET region 315 and third fins 520 in the P-type FET region 325. In the present embodiment, the second fin 510 is formed as a stack of layers, 420, 410 and 210 (in an order from top to bottom). The third fin 520 is formed by the substrate material 210. The recessing process may include dry etching process, wet etching process, and/or combination thereof.

Referring to FIG. 7, in some embodiments, the second and third fins, 510 and 520, have source/drain regions 530 and a gate region 540. In some embodiments, a source/drain region 530 is a source region, and another source/drain region 530 is a drain region. The source/drain regions 530 are separated by the gate region 540.

Figure 8B:
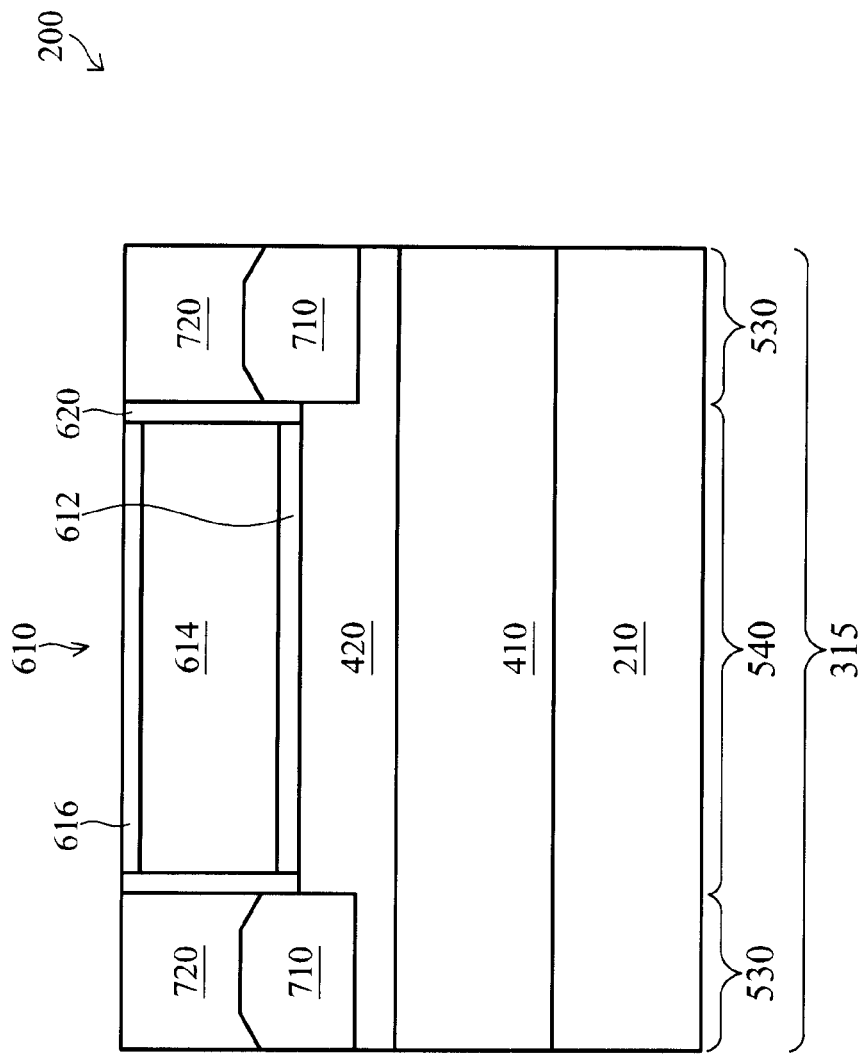
FIGS. 8B, 9B, 10B, 11B and 13B are cross-sectional views of a FinFET device along line B-B in FIG. 7 at fabrication stages constructed according to the method of FIG. 1.

Referring to FIGS. 1 and 8A-8B, the method 100 proceeds to step 110 by forming a gate stack 610 and sidewall spacers 620 along the gate stack 610. In a gate first process, the gate stack 610 may be all or part of a functional gate. Conversely, in a gate last process, the gate stack 610 may be a dummy gate. In the present embodiment, the gate stack 610 is a dummy gate. The dummy gate stacks 610 are to be replaced later by a high-k (HK) and metal gate (MG) after high thermal temperature processes are performed, such as thermal processes during sources/drains formation. The dummy gate stack 610 is formed on the substrate 210 including wrapping over a portion of the second and third fins, 510 and 520. The dummy gate stack 610 may include a dielectric layer 612, a polysilicon layer 614 and a third hard mask 616. The dummy gate stack 610 is formed by any suitable process or processes. For example, the gate stack 610 can be formed by a procedure including depositing, photolithography patterning, and etching processes. The deposition processes include CVD, PVD, ALD, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The dielectric layer 612 includes silicon oxide, silicon nitride, or any other suitable materials. The third hard mask 616 includes any suitable material, for example, silicon nitride, silicon oxynitride and silicon carbide.

The sidewall spacers 620 may include a dielectric material such as silicon oxide, silicon nitride, silicon carbide, silicon oxynitride, or combinations thereof. The sidewall spacers 620 may include a multiple layers. Typical formation methods for the sidewall spacers 620 include depositing a dielectric material over the gate stack 610 and then anisotropically etching back the dielectric material. The etching back process may include a multiple-step etching to gain etch selectivity, flexibility and desired overetch control.

Referring again to FIGS. 1 and 8A-8B, the method 100 proceeds to step 112 by forming source/drain features 710 in the source/drain regions 530. The source/drain features 710 may be formed by recessing a portion of the second and third fins, 510 and 520, in the source/drain regions 530 to form source/drain recessing trenches and epitaxially growing a third semiconductor material layer in the sources/drains recessing trenches. The third semiconductor material layer includes Ge, Si, GaAs, AlGaAs, SiGe, GaAsP, or other suitable material. The source/drain features 710 may be formed by one or more epitaxy or epitaxial (epi) processes. The source/drain features 710 may be in-situ doped during the epi process. For example, the epitaxially grown SiGe source/drain features 710 may be doped with boron; and the epitaxially grown Si epi source/drain features 710 may be doped with carbon to form Si:C source/drain features, phosphorous to form Si:P source/drain features, or both carbon and phosphorous to form SiCP source/drain features. In one embodiment, the source/drain features 710 are not in-situ doped, an implantation process (i.e., a junction implant process) is performed to dope the source/drain features 710. Additionally, an interlayer dielectric (ILD) layer 720 is formed between the dummy gate stacks 610 on the substrate 210. The ILD layer 720 includes silicon oxide, oxynitride or other suitable materials. The ILD layer 720 includes a single layer or multiple layers. The ILD layer 720 is formed by a suitable technique, such as CVD, ALD and spin-on (SOG). A chemical mechanical polishing (CMP) process may be performed to remove excessive ILD layer 720 and planarize the top surface of the ILD layer 720 with the top surface of the dummy gate stacks 610.

Figure 9A:
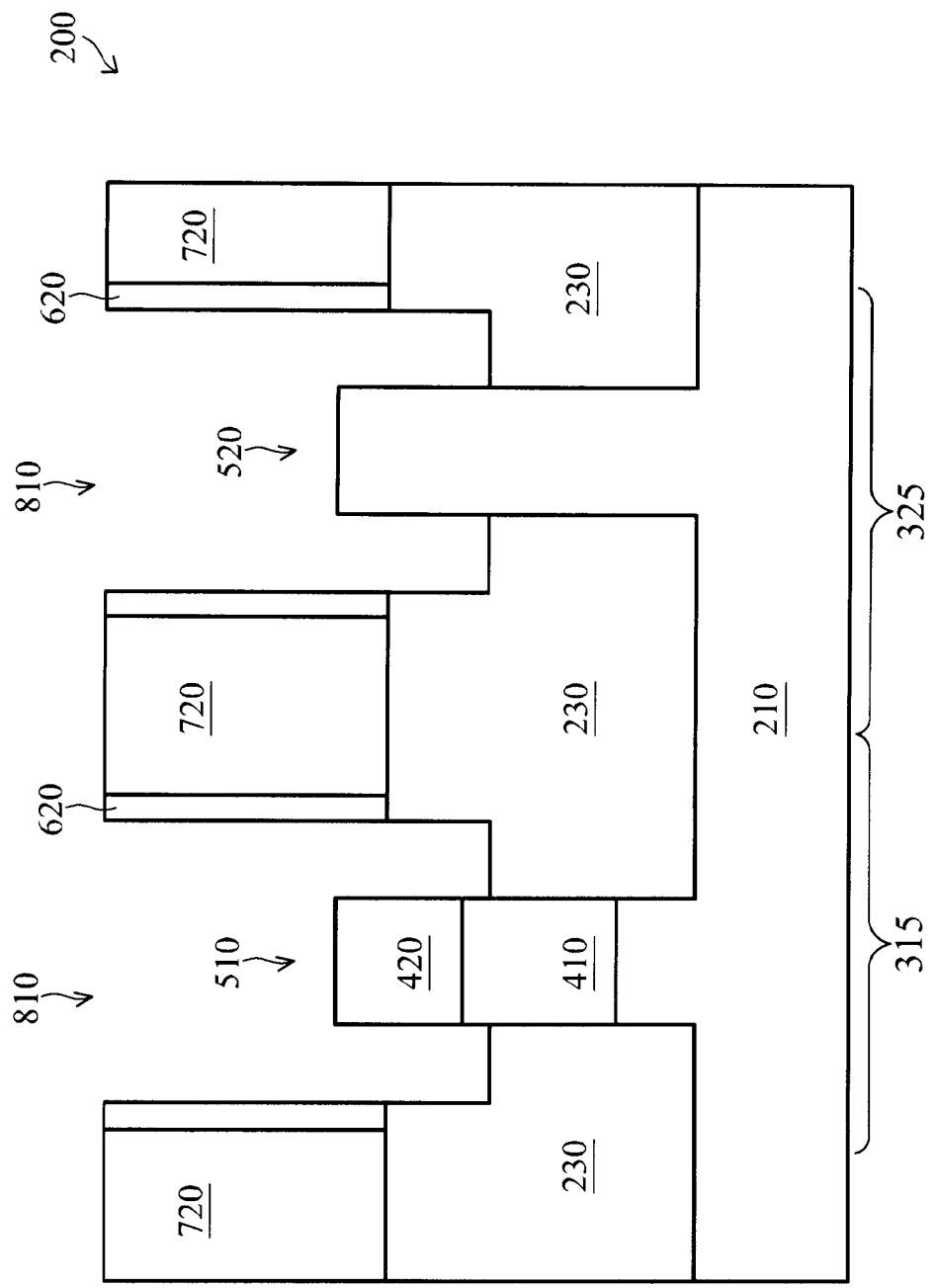
Figure 9B:
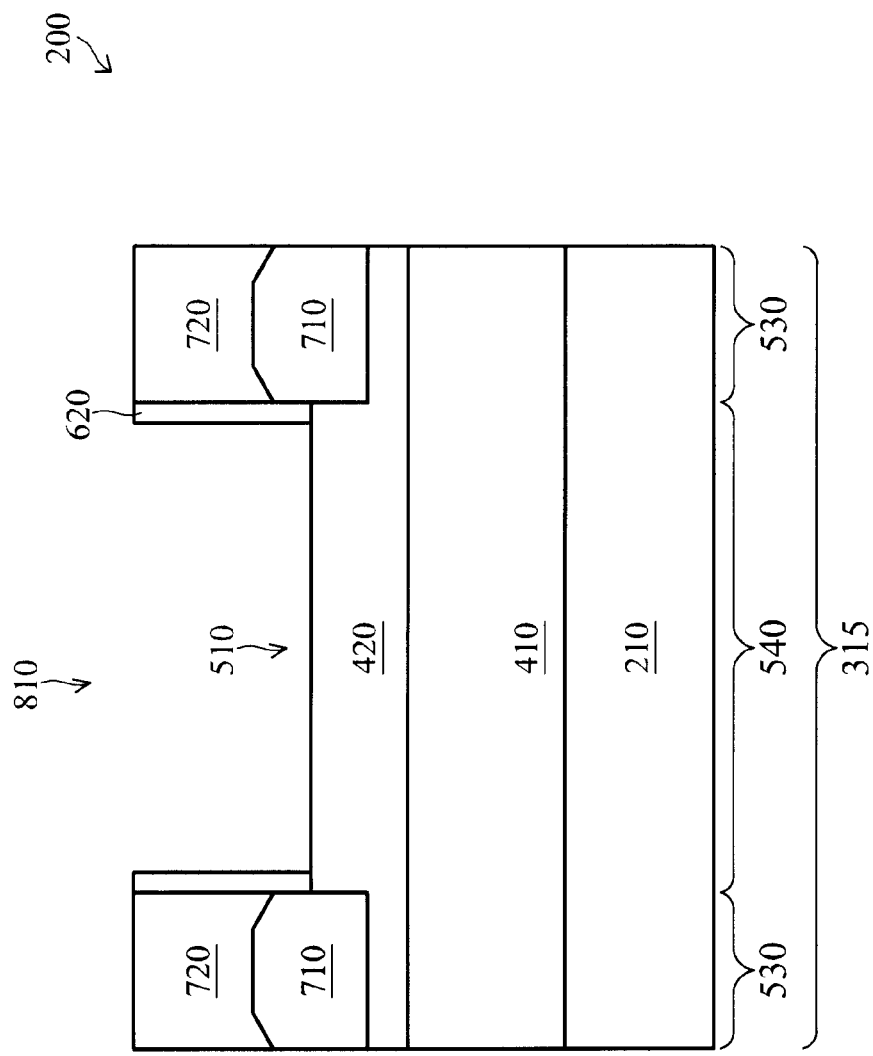

Referring to FIGS. 1 and 9A-9B, the method 100 proceeds to step 114 by removing the dummy gate stacks 610 to form a gate trench 810 and recessing the isolation regions 230 in the gate trench 810 to laterally expose at least a portion of the first semiconductor material layer 410 of the second fin 510, as well as the third fin 520. The etching processes may include selective wet etch or selective dry etch, such that having an adequate etch selectivity with respect to the first and second semiconductor material layers, 410 and 420, and the sidewall spacer 620. Alternatively, the dummy gate stack 610 and the isolation regions 230 may be recessed by a series of processes including photolithography patterning and etching back.

Figure 10A:
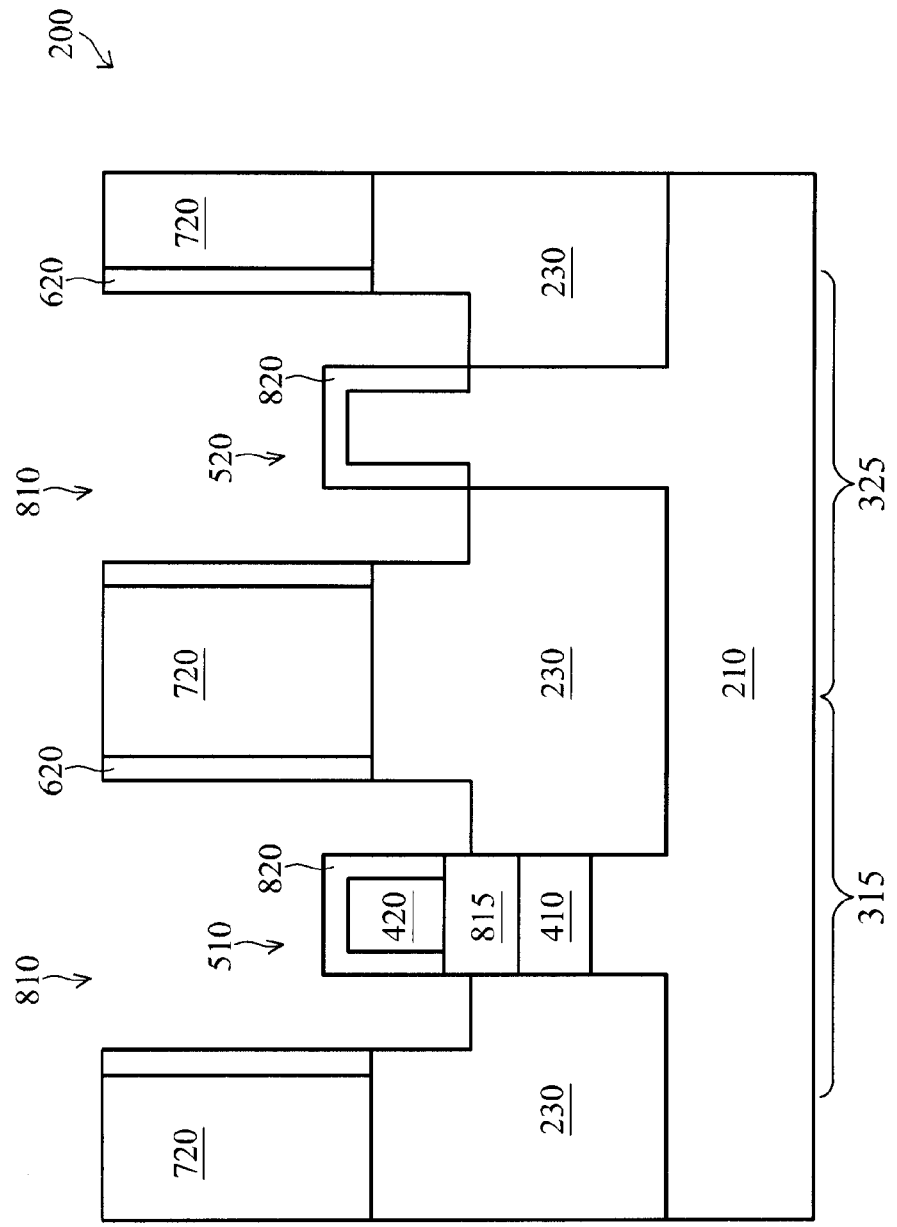
Figure 10B:
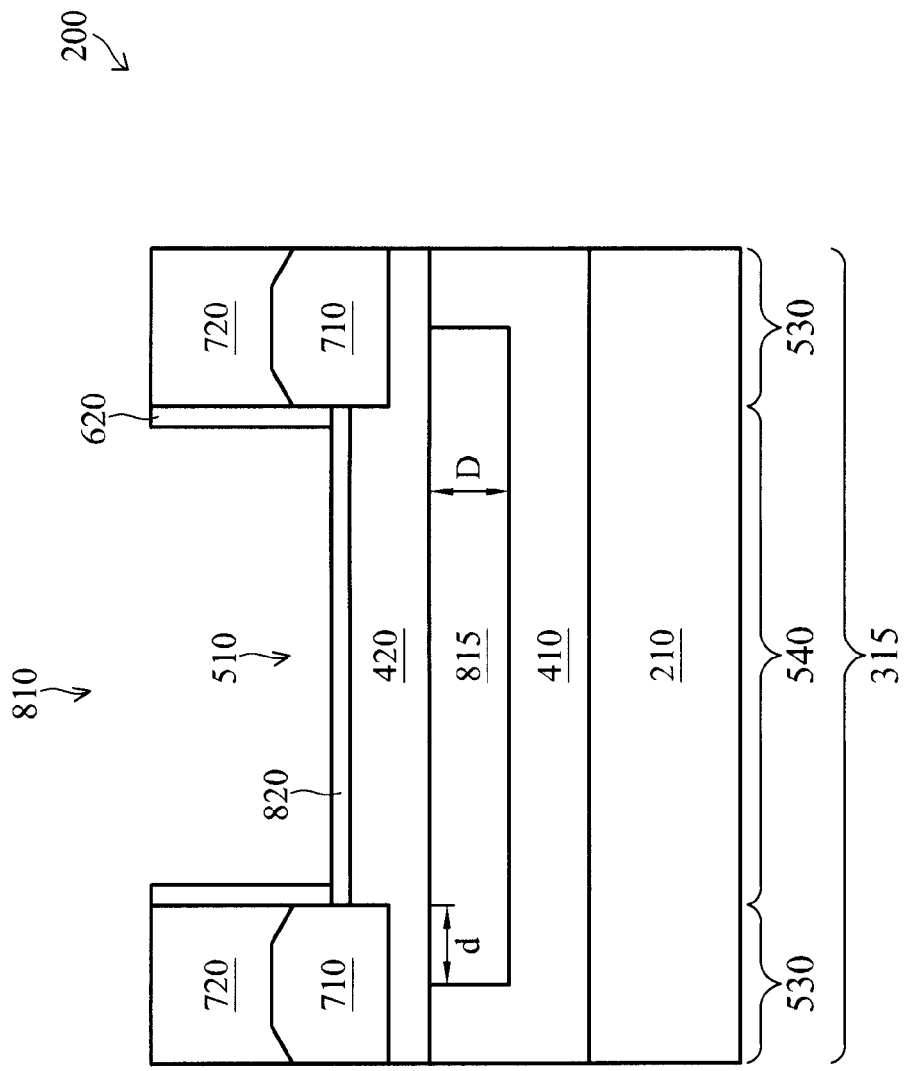

Referring to FIGS. 1 and 10A-10B, the method 100 proceeds to step 116 by performing a thermal oxidation process to the exposed first and second semiconductor material layers, 410 and 420 in the second fin 510 in the gate region 810. In the one embodiment, the thermal oxidation process is conducted in oxygen ambient. In another embodiment, the thermal oxidation process is conducted in a combination of steam ambient and oxygen ambient. During the thermal oxidation process, an upper portion, with a depth (D), of the first semiconductor material layer 410 in the second fin 510 converts to a first semiconductor oxide layer 815 and the conversion extends from the gate region 540 to the first semiconductor material layer 410 in the adjacent source/drain regions 530 with an extension depth (d) in the N-FET region 315. In one embodiment, instead of a whole upper portion, an outer portion of the upper portion of first semiconductor material layer 410 in the second fin 510 is converted to the first semiconductor oxide layer 815.

During the thermal oxidation process, simultaneously at least an outer layer of the exposed second semiconductor material layer 420 in the gate trench 810 converts to a second semiconductor oxide 820. The first semiconductor material layer 410 obtains a first volume expansion and the second semiconductor material layer 420 obtains a second volume expansion in the thermal oxidation process. In the present embodiment, the first semiconductor material layer 410 is chosen such that it has a substantial lager expansion volume than the second semiconductor material layer 420 in the thermal oxidation process. With a larger volume expansion, the first semiconductor oxide layer 815 applies a stress to the second semiconductor material layer 420 in the second fin 510, where a gate channel is to be formed.

As an example, the first semiconductor material layer 410 is $SiGe_x$ and the second semiconductor material layer 420 is Si, where x is Ge composition in atomic percent and it may be adjusted to meet a predetermined volume expansion target. In one embodiment, x is in a range from 40% to 70%. During the thermal oxidation process, the upper portion of the $SiGe_x$ layer 410 converts to a silicon germanium oxide ($SiGeO_y$) layer 815 with the depth (D) in the second fin 510, where y is oxygen composition in atomic percent, and it extends to a portion of the upper portion of the SiGe layer 410 in the source/drain regions 530 of the N-FET region 315, with the extension depth (d). Simultaneously the outer layer of the Si layer 420 converts to silicon oxide ($SiO_z$) 820, where z is oxygen composition in atomic percent. A tensile strain may be induced to the Si layer 420 in the second fin 510 by a volume expansion of the $SiGeO_y$ layer 815.

Figure 11A:
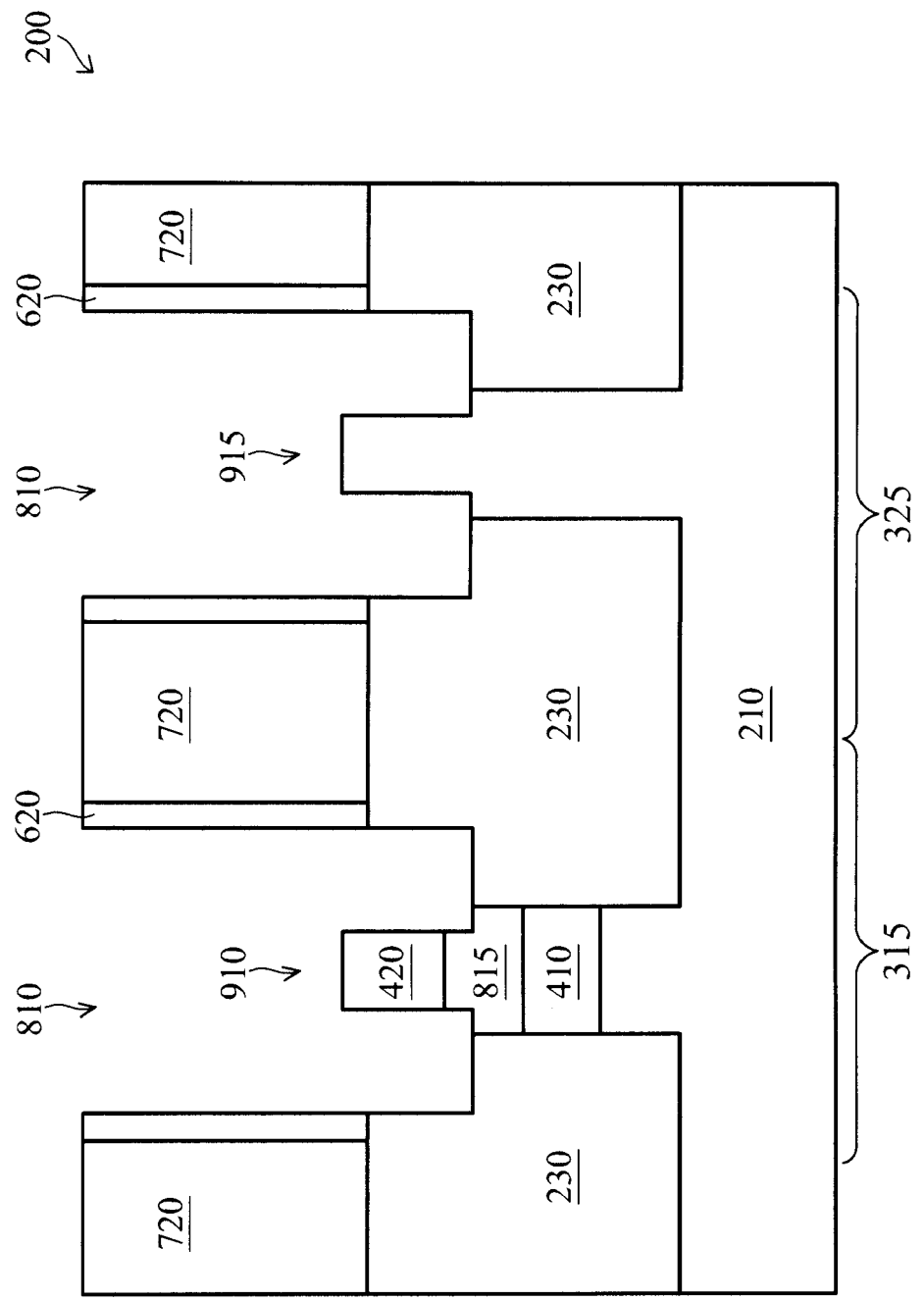
Figure 11B:
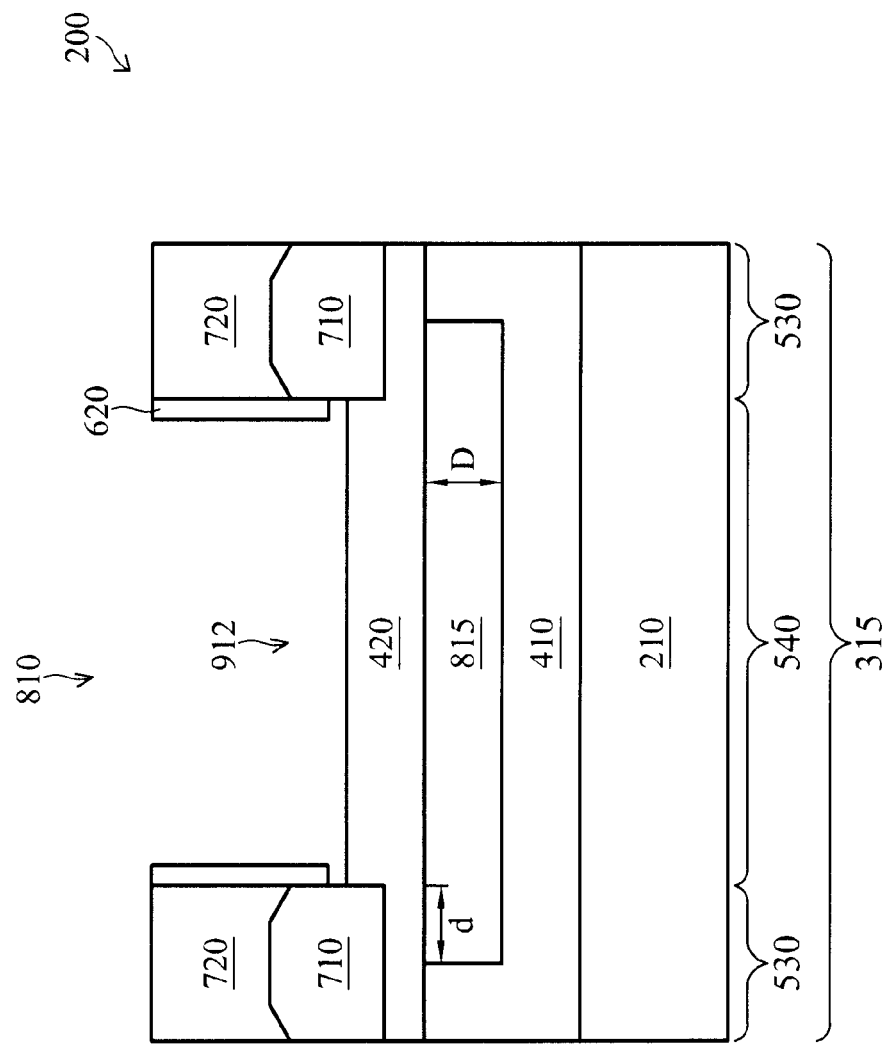

Referring to FIGS. 1 and 11A-11B, the method 100 proceeds to step 118 by removing the second semiconductor oxide layer 820 and a portion of an outer layer of the first semiconductor oxide layer 815 to reveal a fourth fin 910 in the gate region 540 of the N-FET region 315, a fifth fin 912 in the source/drain region 530 of the N-FET region 315 and a sixth fin 915 in the P-FET region 325. Thus, the fourth fin 910 is configured such that it has the second semiconductor material layer 420 as an upper portion, the first semiconductor oxide layer 815 as a middle portion and the first semiconductor material layer 410 as a lower portion. The fifth fin 912 is configured such that it has the second semiconductor material layer 420 as an upper portion, the first semiconductor oxide layer 815 as a first middle portion with the width of d, which directly contacts the middle portion of the fourth fin 910, the first semiconductor material layer 410 as a second middle portion beside its first middle portion and the first semiconductor material layer 410 as the lower portion. The sixth fin 915 is formed by the substrate 210.

The second semiconductor oxide layer 820 and a portion of the outer layer of the first semiconductor oxide layer 815 may be removed by a selective wet etch or a selective dry etch, such that it has an adequate etch selectivity with respect to the first and second semiconductor material layers, 410 and 420. As an example, the SiOz layer 820 and the outer layer of the SiGeOy are removed to reveal Si/SiGeOy/SiGex fin 910 and 912 in N-FET region 315, and a Si fin 915 in the PFET region 325.

Figure 12:
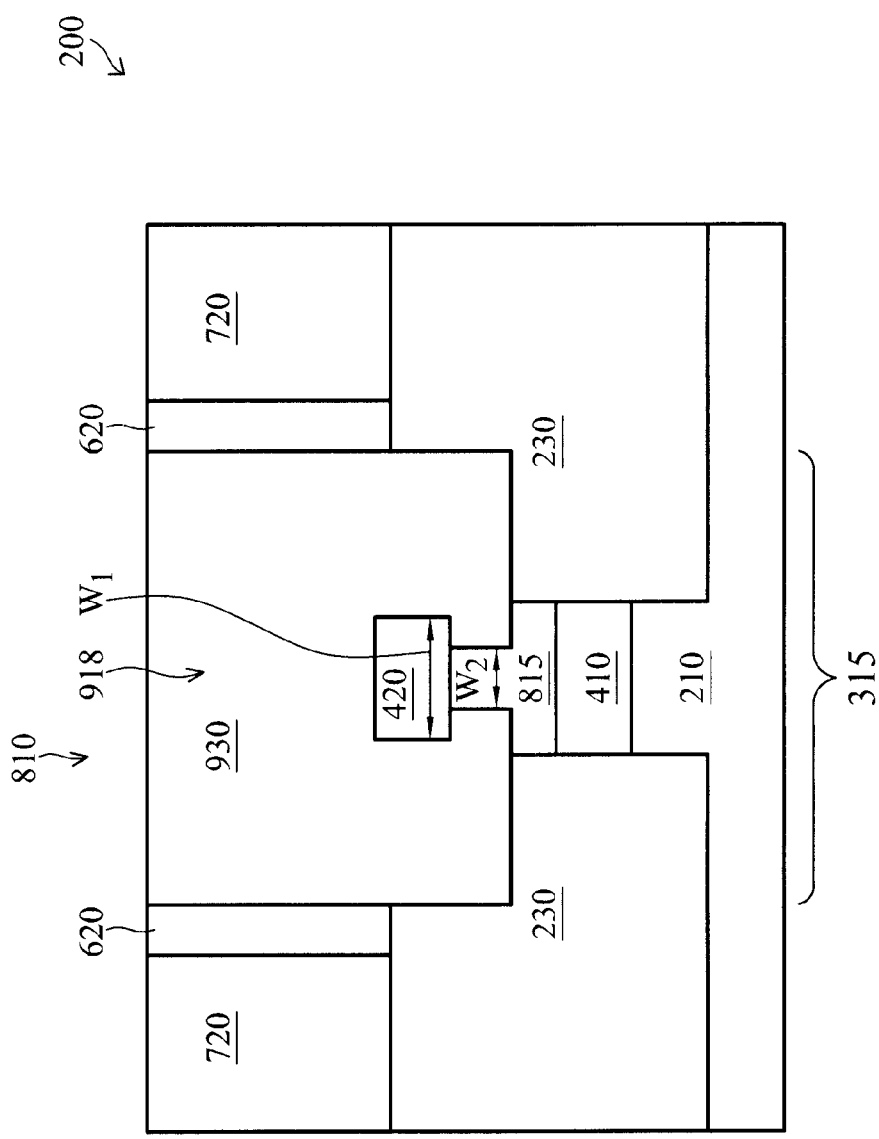

Referring to FIG. 12, in one embodiment, an omega-shape fin 918 is formed in the N-FET region 315 by undercut etching an upper portion of the first semiconductor oxide layer 815. The upper portion of the first semiconductor oxide layer 815 is etched to a first width $w_1$, which is substantially smaller than a second width $w_2$ of the second semiconductor oxide layer 420. For example, an isotropic etching is performed to undercut the upper portion of the first semiconductor oxide layer 815 and form the omega-shape fin 918 such that the second semiconductor layer 420 with the second width $w_2$ connecting directly to the upper portion of the first semiconductor oxide layer 815 with the second width $w_1$.

Figure 13A:
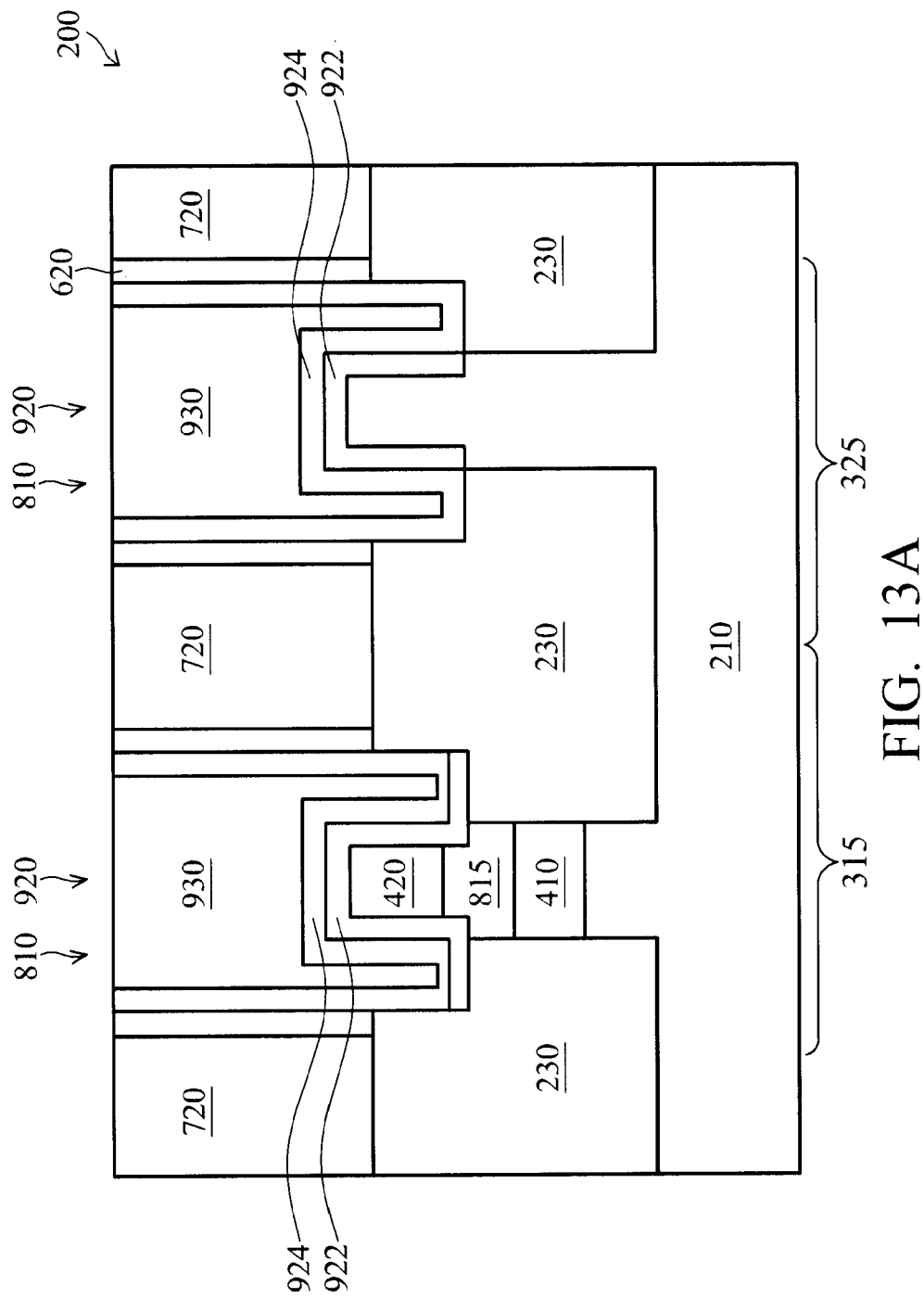
Figure 13B:
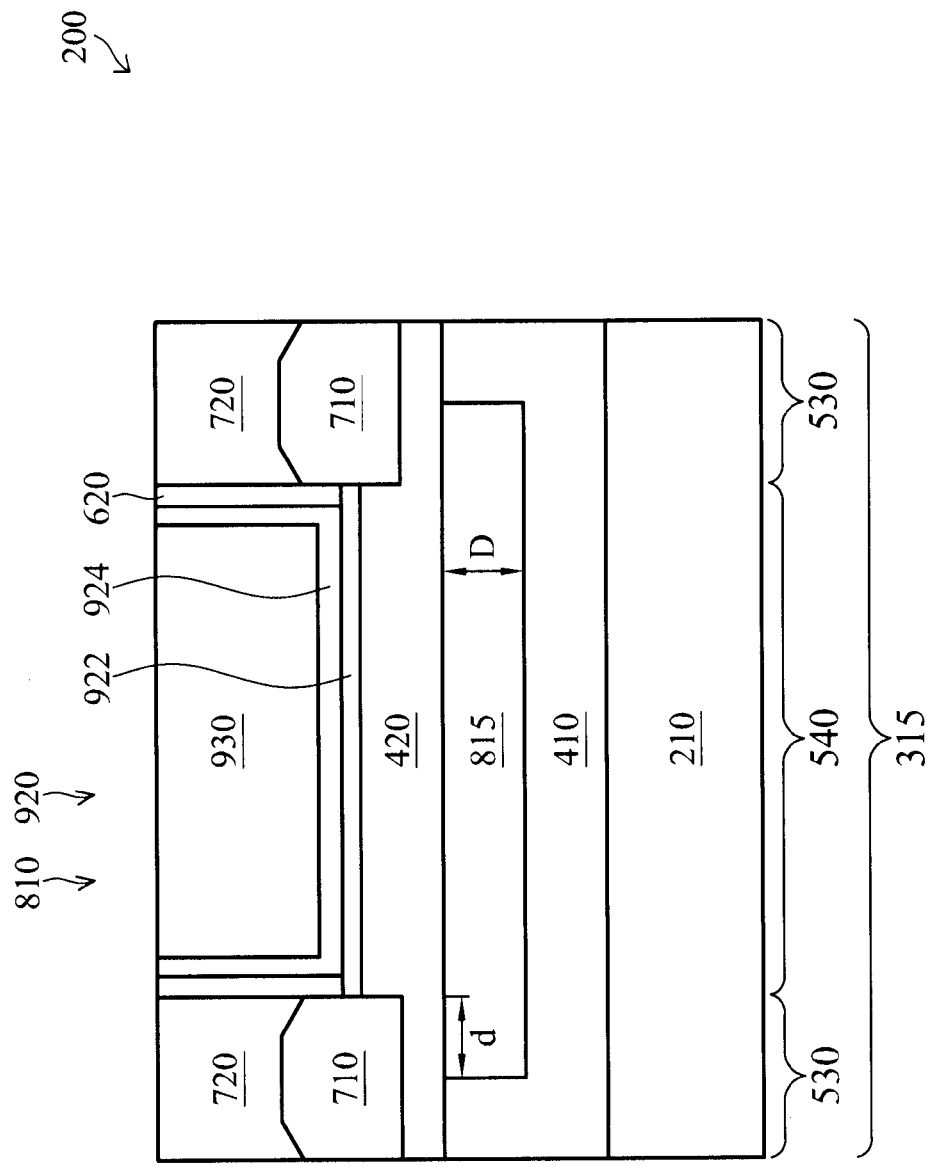

Referring to FIGS. 1 and 13A-13B, the method 100 proceeds to step 120 by forming a high-k (HK)/metal gate (MG) 920 over the substrate 210, including wrapping over a portion of the fourth 910, fifth fin 912, and sixth fin 915, where the fourth and sixth fins serve as gate channel regions. An interfacial layer (IL) 922 is deposited by any appropriate method, such as atomic layer deposition (ALD), chemical vapor deposition CVD and ozone oxidation. The IL 922 includes oxide, HfSiO and oxynitride. A HK dielectric layer 924 is deposited on the IL 922 by suitable techniques, such as ALD, CVD, metal-organic CVD (MOCVD), physical vapor deposition (PVD), thermal oxidation, combinations thereof, or other suitable techniques. The HK dielectric layer 924 may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

A metal gate (MG) layer 930 may include a single layer or multi layers, such as metal layer, liner layer, wetting layer, and adhesion layer. The MG layer 930 may include Ti, Ag, Al, TiAlN, TaC, TaCN, TaSiN, Mn, Zr, TiN, TaN, Ru, Mo, Al, WN, Cu, W, or any suitable materials. The MG layer 930 may be formed by ALD, PVD, CVD, or other suitable process. The MG layer 930 may be formed separately for the N-FET and P-FFET with different metal layers. A CMP may be performed to remove excessive MG layer 930. The CMP provides a substantially planar top surface for the metal gate layer 930 and the ILD layer 720.

Figure 14:
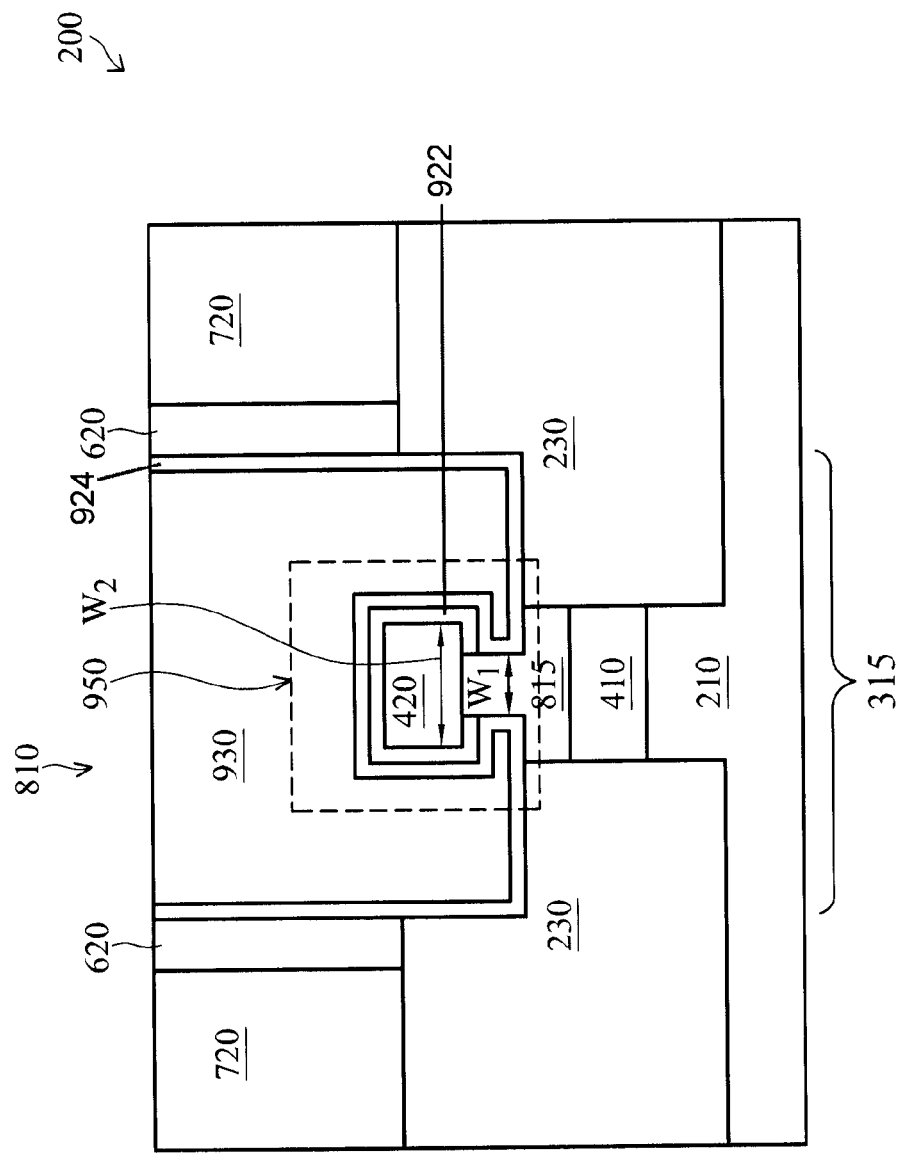

Referring to FIG. 14, in one embodiment, an omega-shape HK/MG 950 is formed by depositing the IL 922, HK dielectric layer 924 and the metal gate layer 930 over the omega-shape fin 918 in the NFET region 315.

The FinFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps can be provided before, during, and after the method 100, and some of the steps described can be replaced or eliminated for other embodiments of the method.

Based on the above, the present disclosure offers a semiconductor device with a strain gate channel in N-FET by using volume expansion technique. The volume expansion technique employs two semiconductor materials with a substantial different volume expansion during a thermal oxidation processes to induce an efficient strain to the gate channel to improve device performance.

The present disclosure provides many different embodiments of a semiconductor device. The semiconductor device includes a substrate having an N-type field-effect transistor (N-FET) region, a gate region, source and drain (S/D) regions separated by the gate region and a first fin structure in a gate region in the N-FET region. The first fin structure includes a first semiconductor material layer as a lower portion, a semiconductor oxide layer as a middle portion and a second semiconductor material layer as an upper portion. The semiconductor device also includes a second fin structure in S/D regions in the N-FET region. The second fin structure includes the first semiconductor material layer as a lower portion and the semiconductor oxide layer as a first middle portion and directly contacts the middle portion of the first fin in the gate region. The second fin also includes the first semiconductor material layer as a second middle portion besides the first middle porting and the second semiconductor material layer as an upper portion. The semiconductor device also includes a source/drain feature on top of the upper portion of the second fin structure in the source/drain region.

In another embodiment, a FinFET device includes a substrate having an N-type field-effect transistor (N-FET) region, a gate region in the N-FET region, source and drain regions separated by the gate region and a first fin structure in a gate region in the N-FET region. The first fin structure includes a silicon germanium (SiGex) layer as a lower portion, a silicon germanium oxide (SiGeOy) layer as a middle portion and a Si layer as an upper portion. The FinFET device also includes a second fin structure in S/D regions in the N-FET region. The second fin structure includes the SiGex layer as a lower portion, the SiGeOy as a first middle portion, which directly contacts the middle portion of the first fin in the gate region. The second fin structure also includes the SiGex as a second middle portion beside the first middle portion and the Si layer as an upper portion. The FinFET device also includes a source/drain feature on top of the upper portion of the second fin structure in the source/drain region and a high-k/metal gate (HKMG) on the substrate including wrapping over a portion of the first fin structure.

In yet another embodiment, a method for fabricating a FinFET device includes providing a substrate providing a substrate. The substrate has first fins in a N-type field-effect transistor (N-FET) region and isolation regions between the first fins. The method also includes recessing the first fins, epitaxially growing a first semiconductor material layer on the recessed first fins, epitaxially growing a second semiconductor material on top of the first semiconductor material layer, recessing the isolation region to laterally expose an upper portion of the second semiconductor material to form second fins, forming a dummy gate stack on the substrate including wrapping over a portion of the second fins, recessing another portion of the second fins beside of the dummy gate stack, epitaxially growing a third semiconductor material on recessed second fins to form a source/drain feature, removing the dummy gate stack to form a gate trench, recessing the isolation region in the gate trench to laterally exposed a portion of the second fins, applying a thermal oxidation process to the first and second semiconductor material layers of the second fin in the gate trench to convert a portion of the first semiconductor to a first semiconductor oxide and an outer layer of the second semiconductor to a second semiconductor oxide. The method also includes removing the second semiconductor oxide to reveal the second semiconductor material as the upper portion of the second fin in the gate trench and forming a high-k/metal gate (HK/MG) stack wrapping over a portion of the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate having an N-type field-effect transistor (N-FET) region;
    a gate region in the N-FET region;
    source and drain (S/D) regions separated by the gate region in the N-FET region;
    a first portion of a fin structure in the gate region of the N-FET region, the first portion of the fin structure including:
        a first semiconductor material layer as a lower portion of the first portion of the fin structure;
        a semiconductor oxide layer as a middle portion of the first portion of the fin structure; and
        a second semiconductor material layer as an upper portion of the first portion of the fin structure;
    a second portion of the fin structure in the S/D regions of the N-FET region, the second portion of the fin structure including:
        the first semiconductor material layer as a lower portion of the second portion of the fin structure;
        the semiconductor oxide layer as a first middle portion of the second portion of the fin structure, wherein the first middle portion of the second portion of the fin directly contacts the middle portion of the first portion of the fin structure in the gate region;
        the first semiconductor material layer as a second middle portion beside the first middle portion of the second portion of the fin structure; and
        the second semiconductor material layer as an upper portion of the second portion of the fin structure;
    source/drain features on top of the upper portion of the second portion of the fin structure in the source/drain region; and
    a high-k (HK)/metal gate (MG) stack on the substrate including wrapping over a portion of the first portion of the fin structure in the gate region.

2. The semiconductor device of claim 1, wherein the first semiconductor material has a larger volume expansion than the second semiconductor material in a thermal oxidation process in oxygen ambient.

3. The semiconductor device of claim 2, wherein the thermal oxidation process is conducted in a combination of steam ambient and oxygen ambient.

4. The semiconductor device of claim 2, wherein the first semiconductor material includes an epitaxial growth silicon germanium (SiGex), where x is Ge composition in atomic percent.

5. The semiconductor device of claim 4, wherein x is selected to meet a predetermined target of volume expansion during the thermal oxidation process.

6. The semiconductor device of claim 2, wherein the second semiconductor material includes silicon (Si).

7. The semiconductor device of claim 1, wherein the semiconductor oxide material is an oxide of the first semiconductor material with a depth (D).

8. The semiconductor device of claim 7, wherein the semiconductor oxide material includes SiGeOy, where y is oxygen composition in atomic percent.

9. The semiconductor device of claim 1, wherein the first middle portion of the second portion of the fin structure is an extension of the middle portion of the first portion of the fin structure in the gate region, with an extension depth (d).

10. The semiconductor device of claim 9, wherein the first middle portion of the second portion of the fin structure includes SiGeOy, where y is oxygen composition in atomic percent.

11. The semiconductor device of claim 1, wherein the second middle portion of the second portion of the fin structure includes SiGex, where x is Ge composition in atomic percent.

12. The semiconductor device of claim 1, wherein the upper portion of the second portion of the fin structure includes Si.

13. The semiconductor device of claim 1, wherein the source/drain features include an epitaxially growth semiconductor material.

14. The semiconductor device of claim 1, wherein the first portion of the fin structure is a omega-shape, which includes:
    the first semiconductor material layer as the lower portion of the first portion of the fin structure;
    the semiconductor oxide layer as the middle portion of the first portion of the fin structure with a first width; and
    the second semiconductor material layer as the upper portion of the first portion of the fin structure with a second width, which is substantially smaller than the first width.

15. A semiconductor device comprising:
    a substrate having an N-type field-effect transistor (N-FET) region;
    a gate region in the N-FET region;
    source and drain regions separated by a gate region in the N-FET region;
    a first portion of a fin structure in the gate region of the N-FET region, the first portion of the fin structure including:
        a silicon germanium (SiGex) layer as a lower portion, where x is Ge composition in atomic percent;
        a silicon germanium oxide (SiGeOy) layer as a middle portion, where y is oxygen composition in atomic percent; and
        a Si layer as an upper portion;
    a second portion of the fin structure in the source and drain regions of the N-FET region, the second portion of the fin structure including:
        the SiGex layer as a lower portion;
        the SiGeOy as a first middle portion, wherein the first middle portion directly contacts the middle portion of the first portion of the fin structure in the gate region;
        the SiGex as a second middle portion beside the first middle; and
        the Si layer as an upper portion;
    source/drain features on top of the upper portion of the second portion of the fin structure in the source and drain regions; and a high-k/metal gate (HKMG) on the substrate including wrapping over a portion of the first portion of the fin structure.

16. A semiconductor device comprising:

a first portion of a fin structure including: a first semiconductor material layer as a lower portion of the first portion of the fin structure, a semiconductor oxide layer as a middle portion of the first portion of the fin structure, and a second semiconductor material layer as an upper portion of the first portion of the fin structure; and a second portion of the fin structure including: the first semiconductor material layer as a lower portion of the second portion of the fin structure, the semiconductor oxide layer as a first middle portion of the second portion of the fin structure, the first semiconductor material layer as a second middle portion beside the first middle portion of the second portion of the fin structure, and the second semiconductor material layer as an upper portion of the second portion of the fin structure, wherein the second semiconductor material of the upper portion of the second portion of the fin structure physically contacts the first semiconductor material layer of the second middle portion of the second portion of the fin structure.

17. The device of claim 16, further comprising:

a high-k (HK)/metal gate (MG) stack on the substrate wrapping over a portion of the first portion of the fin structure in a gate region.

18. The device of claim 16, wherein the first semiconductor material includes silicon germanium (SiGe) and the second semiconductor material includes silicon.

19. The device of claim 16, further comprising:

source/drain features on top of the upper portion of the second portion of the fin structure.

20. The device of claim 1, further comprising:

a gate disposed over the first portion of the fin structure; and a source/drain feature disposed over the second portion of the fin structure.

* * * * *